United States Patent
Nishio et al.

(10) Patent No.: US 11,764,059 B2
(45) Date of Patent: Sep. 19, 2023

(54) METHOD FOR MANUFACTURING SUBSTRATE, METHOD FOR MANUFACTURING SEMICONDUCTOR DEVICE, SUBSTRATE, AND SEMICONDUCTOR DEVICE

(71) Applicant: KABUSHIKI KAISHA TOSHIBA, Tokyo (JP)

(72) Inventors: Johji Nishio, Machida (JP); Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 236 days.

(21) Appl. No.: 17/014,272

(22) Filed: Sep. 8, 2020

(65) Prior Publication Data

US 2021/0111024 A1   Apr. 15, 2021

(30) Foreign Application Priority Data

Oct. 9, 2019   (JP) .................................. 2019-186235

(51) Int. Cl.
*H01L 21/02*   (2006.01)
*H01L 21/66*   (2006.01)
(Continued)

(52) U.S. Cl.
CPC .... *H01L 21/02634* (2013.01); *H01L 21/0262* (2013.01); *H01L 21/02378* (2013.01);
(Continued)

(58) Field of Classification Search
CPC ......... H01L 21/02378; H01L 21/02447; H01L 21/02502; H01L 21/02529;
(Continued)

(56) References Cited

U.S. PATENT DOCUMENTS

| 7,646,026 B2 | 1/2010 | Friedrichs et al. |
| 9,691,842 B2 | 6/2017 | Sato et al. |

(Continued)

FOREIGN PATENT DOCUMENTS

| JP | 2007-13058 A | 1/2007 |
| JP | 4857697 B2 | 1/2012 |

(Continued)

OTHER PUBLICATIONS

T. Tawara et al., "Short minority carrier lifetimes in highly nitrogen-doped 4H—SiC epilayers for suppression of the stacking fault formation in PiN diodes", Journal of Applied Physics 120, 2016, 8 pages.

*Primary Examiner* — Eric A. Ward
(74) *Attorney, Agent, or Firm* — Oblon, McClelland, Maier & Neustadt, L.L.P.

(57) ABSTRACT

According to one embodiment, a method for manufacturing a substrate is disclosed. The method can include preparing a structure body. The structure body includes a first semiconductor member and a second semiconductor member. The first semiconductor member includes silicon carbide including a first element. The second semiconductor member includes silicon carbide including a second element. The first element includes at least one selected from a first group consisting of N, P, and As. The second element includes at least one selected from a second group consisting of B, Al, and Ga. The method can include forming a hole that extends through the second semiconductor member and reaches the first semiconductor member. In addition, the method can include forming a third semiconductor member in the hole. The third semiconductor member includes silicon carbide including a third element. The third element includes at least one selected from the first group.

13 Claims, 12 Drawing Sheets

(51) Int. Cl.
- *H01L 29/16* (2006.01)
- *H01L 21/04* (2006.01)
- *H01L 29/06* (2006.01)
- *H01L 29/78* (2006.01)
- *H01L 29/167* (2006.01)
- *H01L 29/872* (2006.01)
- *H01L 29/739* (2006.01)

(52) U.S. Cl.
CPC .. *H01L 21/02447* (2013.01); *H01L 21/02502* (2013.01); *H01L 21/02529* (2013.01); *H01L 21/0475* (2013.01); *H01L 22/20* (2013.01); *H01L 29/0684* (2013.01); *H01L 29/1608* (2013.01); *H01L 29/167* (2013.01); *H01L 29/7395* (2013.01); *H01L 29/7802* (2013.01); *H01L 29/872* (2013.01)

(58) Field of Classification Search
CPC ........... H01L 21/02576; H01L 21/0262; H01L 21/02634; H01L 21/0475; H01L 22/12; H01L 22/20; H01L 29/063; H01L 29/0634; H01L 29/0684; H01L 29/0878; H01L 29/1095; H01L 29/1608; H01L 29/167; H01L 29/6606; H01L 29/66068; H01L 29/7395; H01L 29/7802; H01L 29/872

See application file for complete search history.

(56) References Cited

U.S. PATENT DOCUMENTS

| | | | |
|---|---|---|---|
| 2007/0007537 A1* | 1/2007 | Ogura | H01L 29/1033 257/E29.054 |
| 2007/0018243 A1* | 1/2007 | Ono | H01L 29/0634 438/270 |
| 2011/0287598 A1* | 11/2011 | Shimatou | H01L 29/66734 438/270 |
| 2014/0209927 A1 | 7/2014 | Nishio et al. | |
| 2017/0271442 A1 | 9/2017 | Uehara | |
| 2018/0323263 A1 | 11/2018 | Tawara et al. | |
| 2019/0244812 A1 | 8/2019 | Nishio et al. | |
| 2019/0252517 A1* | 8/2019 | Kawada | H01L 21/02529 |
| 2020/0251560 A1 | 8/2020 | Nishio et al. | |

FOREIGN PATENT DOCUMENTS

| | | |
|---|---|---|
| JP | 2014-146748 A | 8/2014 |
| JP | 5621442 B2 | 11/2014 |
| JP | 2016-15378 A | 1/2016 |
| JP | 2016-163004 A | 9/2016 |
| JP | 2017-168666 A | 9/2017 |
| JP | 6244826 B2 | 12/2017 |
| JP | 2018-19047 A | 2/2018 |
| JP | 2018-49928 A | 3/2018 |
| JP | 2019-140186 A | 8/2019 |
| JP | 2020-126919 A | 8/2020 |

* cited by examiner

METHOD FOR MANUFACTURING SUBSTRATE, METHOD FOR MANUFACTURING SEMICONDUCTOR DEVICE, SUBSTRATE, AND SEMICONDUCTOR DEVICE

CROSS-REFERENCE TO RELATED APPLICATIONS

This application is based upon and claims the benefit of priority from Japanese Patent Application No. 2019-186235, filed on Oct. 9, 2019; the entire contents of which are incorporated herein by reference.

FIELD

Embodiments of the invention generally relate to a method for manufacturing a substrate, a method for manufacturing a semiconductor device, a substrate, and a semiconductor device.

BACKGROUND

For example, there is a semiconductor device that uses a substrate including silicon carbide (SiC). Stable characteristics of a substrate and the semiconductor device are desirable.

DETAILED DESCRIPTION

Figure 1:
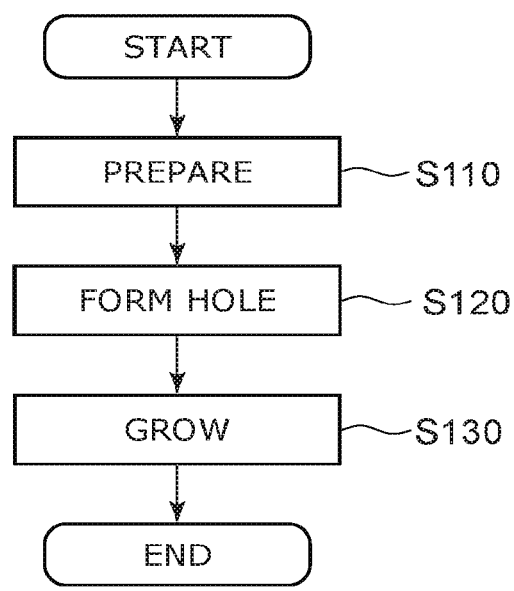
FIG. 1 is a flowchart illustrating a method for manufacturing a substrate according to a first embodiment.

According to one embodiment, a method for manufacturing a substrate is disclosed. The method can include preparing a structure body. The structure body includes a first semiconductor member and a second semiconductor member. The first semiconductor member includes silicon carbide including a first element. The second semiconductor member includes silicon carbide including a second element. The first element includes at least one selected from a first group consisting of N, P, and As. The second element includes at least one selected from a second group consisting of B, Al, and Ga. A direction from the first semiconductor member toward the second semiconductor member is along a first direction. The method can include forming a hole that extends through the second semiconductor member along the first direction and reaches the first semiconductor member. In addition, the method can include forming a third semiconductor member in the hole. The third semiconductor member includes silicon carbide including a third element. The third element includes at least one selected from the first group.

According to one embodiment, a method for manufacturing a semiconductor device is disclosed. The method can include preparing a structure body. The structure body includes a first semiconductor member and a second semiconductor member. The first semiconductor member includes silicon carbide including a first element. The second semiconductor member includes silicon carbide including a second element. The first element includes at least one selected from a first group consisting of N, P, and As. The second element includes at least one selected from a second group consisting of B, Al, and Ga. A direction from the first semiconductor member toward the second semiconductor member is along a first direction. The method can include forming a hole that extends through the second semiconductor member along the first direction and reaches the first semiconductor member. The method can include forming a third semiconductor member in the hole. The third semiconductor member includes silicon carbide including a third element. The third element includes at least one selected from the first group. In addition, the method can include forming a conductive layer electrically connected to a semiconductor layer including the first, second, and third semiconductor members.

According to one embodiment, a substrate includes a base body including silicon carbide, and a semiconductor layer. The semiconductor layer includes a first semiconductor member including silicon carbide including a first element, a second semiconductor member including silicon carbide including a second element, and a third semiconductor member including a third element. The first element includes at least one selected from a first group consisting of N, P, and As. The second element includes at least one selected from a second group consisting of B, Al, and Ga. The third element includes at least one selected from the first group. The first semiconductor member is between the base body and the second semiconductor member in a first direction. At least a portion of the third semiconductor member extends along the first direction in the second semiconductor member and contacts the first semiconductor member. A distance along the first direction between the base body and the at least a portion of the third semiconductor member is less than a distance along the first direction between the base body and the second semiconductor member.

According to one embodiment, a semiconductor device includes a base body including silicon carbide, a semiconductor layer, and a conductive layer electrically connected to the semiconductor layer. The semiconductor layer includes a first semiconductor member including silicon carbide including a first element, a second semiconductor member including silicon carbide including a second element, and a third semiconductor member including a third element. The first element includes at least one selected from a first group consisting of N, P, and As. The second element includes at least one selected from a second group consisting of B, Al, and Ga. The third element includes at least one selected from the first group. The first semiconductor member is between the base body and the second semiconductor member in a first direction. At least a portion of the third semiconductor member extends along the first direction in the second semiconductor member and contacts the first semiconductor member. A distance along the first direction between the base body and the at least a portion of the third semiconductor member is less than a distance along the first direction between the base body and the second semiconductor member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a flowchart illustrating a method for manufacturing a substrate according to a first embodiment.

FIGS. 2A to 2F are schematic cross-sectional views illustrating the method for manufacturing the substrate according to the first embodiment.

As shown in FIG. 1, the method for manufacturing the substrate according to the embodiment includes preparing a structure body (step S110), forming a hole (step S120), and growing a third semiconductor member (step S130).

Figure 2A:
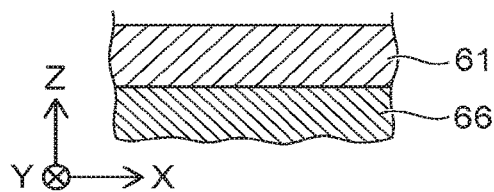
FIGS. 2A to 2F are schematic cross-sectional views illustrating the method for manufacturing the substrate according to the first embodiment.
Figure 2B:
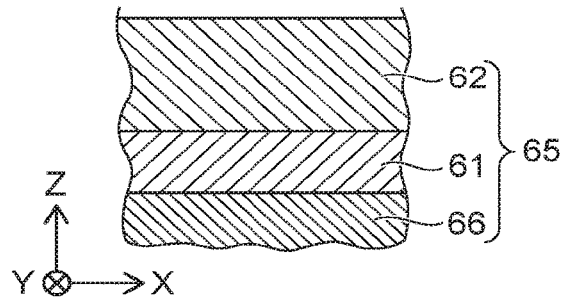

For example, as shown in FIG. 2A, a first semiconductor member 61 is provided on a base body 66. Another layer may be provided between the base body 66 and the first semiconductor member 61. The base body 66 includes silicon carbide (SiC). The first semiconductor member 61 includes silicon carbide. As shown in FIG. 2B, a second semiconductor member 62 is provided on the first semiconductor member 61. The second semiconductor member 62 includes silicon carbide. For example, the second semiconductor member 62 contacts the first semiconductor member 61.

As shown in FIG. 2B, a structure body 65 includes the first semiconductor member 61 and the second semiconductor member 62. The structure body 65 may include the base body 66. Such a structure body is prepared in step S110.

The first semiconductor member 61 includes silicon carbide including a first element. The second semiconductor member 62 includes silicon carbide including a second element. The first element includes at least one selected from a first group consisting of N, P, and As. The second element includes at least one selected from a second group consisting of B, Al, and Ga. For example, the first semiconductor member 61 includes n-type silicon carbide. For example, the second semiconductor member 62 includes p-type silicon carbide.

The direction from the first semiconductor member 61 toward the second semiconductor member 62 is along a first direction. The first direction is taken as a Z-axis direction. A direction perpendicular to the Z-axis direction is taken as an X-axis direction. A direction perpendicular to the Z-axis direction and the X-axis direction is taken as a Y-axis direction.

The base body 66, the first semiconductor member 61, and the second semiconductor member 62 spread along the X-Y plane.

Figure 2C:
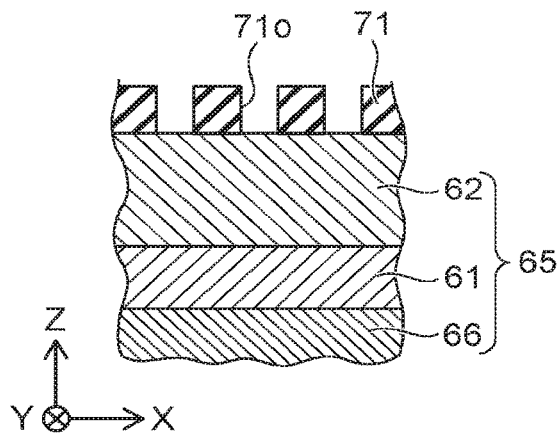

As shown in FIG. 2C, for example, a first mask 71 that has an opening 710 is formed on the second semiconductor member 62. The material of the first mask 71 is, for example, silicon oxide, etc.

Figure 2D:
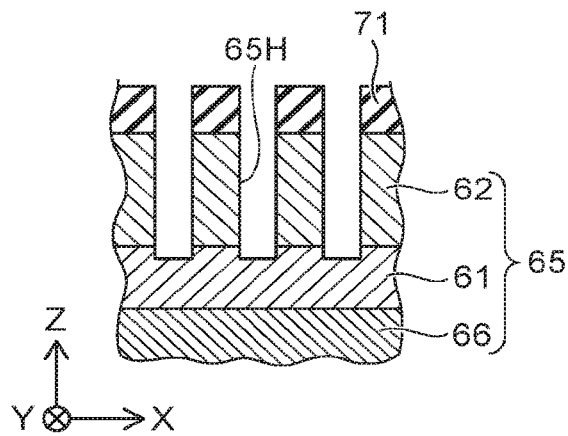

As shown in FIG. 2D, a portion of the second semiconductor member 62 is removed by using the first mask 71 as a mask. A hole 65H is formed thereby. The removal includes, for example, dry etching using $CF_4$ or the like as an etching gas, etc. The formation of the hole 65H corresponds to step S120.

The hole 65H extends through the second semiconductor member 62 along the first direction (the Z-axis direction). The hole 65H reaches the first semiconductor member 61. For example, a portion of the first semiconductor member 61 may be removed by the etching that removes the portion of the second semiconductor member 62. For example, the bottom portion of the hole 65H is in the first semiconductor member 61.

Figure 2E:
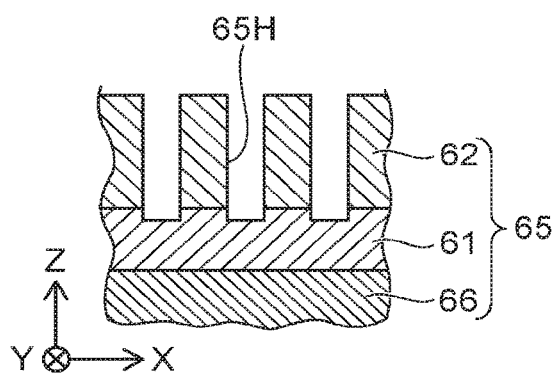

The first mask 71 is removed as shown in FIG. 2E.

Figure 2F:
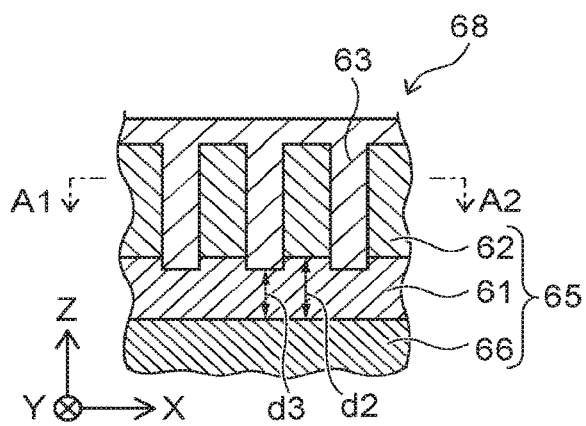

As shown in FIG. 2F, a third semiconductor member 63 is formed in the hole 65H. The third semiconductor member 63 includes silicon carbide including a third element, which includes at least one selected from the first group described above. For example, the third semiconductor member 63 includes n-type silicon carbide. The formation of the third semiconductor member 63 corresponds to step S130. A substrate 68 is obtained by forming such a third semiconductor member 63. In step S130 as shown in FIG. 2F, the third semiconductor member 63 may be formed also on the second semiconductor member 62.

For example, the second semiconductor member 62 and the third semiconductor member 63 are alternately arranged in the X-Y plane. For example, a super junction (SJ) structure is obtained thereby. In the SJ structure, for example, p-type pillars and n-type pillars extend along the Z-axis direction. For example, a low on-resistance can be obtained by such a structure.

According to the method for manufacturing the substrate according to the embodiment, the third semiconductor member 63 can be formed to have uniform characteristics. According to the embodiment, a method for manufacturing a substrate can be provided in which stable characteristics are obtained.

A first reference example for forming a SJ structure may be considered in which a hole is formed in an n-type layer, and the hole is filled with a p-type semiconductor. However, it was found that it is difficult to obtain uniform characteristics by filling the hole with a p-type semiconductor including silicon carbide. It is considered that this is because, for example, the raw material of the p-type impurity that is used when forming the p-type semiconductor includes a hydrocarbon.

When forming a silicon carbide semiconductor that includes an n-type impurity in a hole, epitaxial growth that uses a gas including the first element (at least one selected from the first group consisting of N, P, and As) can be employed. In such a case, the source gas of the n-type impurity is, for example, a nitrogen gas or the like, and the silicon carbide semiconductor that includes the n-type impurity is formed by a vapor phase reaction. In a vapor phase reaction, for example, substantially the same doping characteristics are obtained at the sidewall of the hole and the bottom surface of the hole. Therefore, uniform characteristics are easily obtained when forming the silicon carbide semiconductor including the n-type impurity in the hole.

On the other hand, when forming a silicon carbide semiconductor that includes a p-type impurity in the hole, a method may be considered in which epitaxial growth is performed using a gas including the second element (at least one selected from the second group consisting of B, Al, and Ga). The source gas of the p-type impurity is, for example, trimethylaluminum (TMA), trimethylgallium (TMG), triethylborane (TEB), etc. The source gas of the p-type impurity includes a hydrocarbon. In such a case, the p-type semiconductor grows due to a surface reaction. Therefore, it is considered that the sidewall of the hole and the bottom surface of the hole have different doping characteristics when forming the silicon carbide semiconductor including the p-type impurity in the hole. It is considered that it is difficult to obtain a p-type silicon carbide semiconductor having uniform characteristics in the first reference example.

In particular, the p-type impurity concentration easily becomes nonuniform when forming a p-type silicon carbide semiconductor with a high concentration in a fine hole.

A uniform p-type impurity concentration is relatively easily obtained when forming a silicon carbide semiconductor including the p-type impurity on a widely-exposed surface instead of in a fine hole. It was found that special difficulties occur when forming the silicon carbide semiconductor including the p-type impurity in a fine hole.

In the embodiment, a p-type silicon carbide semiconductor (the second semiconductor member 62) is formed on the first semiconductor member 61 that is widely exposed. A uniform p-type impurity concentration is stably obtained thereby. Subsequently, the hole 65H is formed in the p-type silicon carbide semiconductor, and the hole 65H is filled with an n-type silicon carbide semiconductor (the third semiconductor member 63). As described above, the n-type silicon carbide semiconductor grows due to a vapor phase reaction. A highly-uniform n-type impurity concentration is obtained thereby.

According to the embodiment, a method for manufacturing a substrate can be provided in which stable characteristics are obtained.

A second reference example for forming a nitride semiconductor having a Si structure may be considered in which ion doping of thin n-type silicon carbide layers with Al or the like is repeated. However, it is difficult to obtain high productivity in the second reference example.

According to the embodiment, a substrate having stable characteristics can be manufactured with high productivity.

As described above, the formation of the third semiconductor member 63 includes growing the third semiconductor member 63 by using a gas including a compound that includes the third element and carbon. The compound includes, for example, a hydrocarbon. The formation of the third semiconductor member 63 includes epitaxial growth of the third semiconductor member 63.

In the embodiment, for example, the concentration of the third element (the n-type impurity) in the third semiconductor member 63 is greater than the concentration of the first element (the n-type impurity) in the first semiconductor member 61. The third semiconductor member 63 can be stably formed to have a high impurity concentration. For example, the carrier concentration in the third semiconductor member 63 is greater than the carrier concentration in the first semiconductor member 61. The third semiconductor member 63 can be stably formed to have a high carrier concentration.

For example, the preparation of the structure body 65 (step S110) may include epitaxially growing the second semiconductor member 62 on the first semiconductor member 61 by using a gas including the second element (referring to FIG. 2B).

As described above, the formation of the hole 65H may include removing a portion of the first semiconductor member 61. Thereby, as shown in FIG. 2E, the bottom surface of the hole 65H is in the first semiconductor member 61. The second semiconductor member 62 does not remain at the bottom surface of the hole 65H. By forming the third semiconductor member 63 in the hole 65H, the third semiconductor member 63 contacts the first semiconductor member 61. Good conduction characteristics are obtained.

As shown in FIG. 2F, the first semiconductor member 61 is provided on the base body 66. The distance along the first direction (the Z-axis direction) between the base body 66 and the third semiconductor member 63 is taken as a distance d3. The distance along the first direction between the base body 66 and the second semiconductor member 62 is taken as a distance d2. The distance d3 is less than the distance d2. The bottom portion of the third semiconductor member 63 faces the first semiconductor member 61 in a direction (e.g., the X-axis direction) crossing the first direction (the Z-axis direction). Good conduction characteristics are obtained.

For example, the third semiconductor member 63 that is on the second semiconductor member 62 in the structure illustrated in FIG. 2F may be removed by surface polishing, etc. The second semiconductor member 62 may be exposed. The second semiconductor member 62 may be connected to a p-type layer at the front surface side (the upper side) at a portion different from the cross section illustrated in FIG. 2F. In such a case, the surface polishing and the like can be omitted.

FIGS. 3A to 3F are schematic cross-sectional views illustrating substrates according to the first embodiment. These drawings correspond to cross-sectional views at the position of line A1-A2 of FIG. 2F.

These drawings illustrate configurations of the second and third semiconductor members 62 and 63. The configuration of the third semiconductor member 63 corresponds to the configuration of the hole 65H.

Figure 3A:
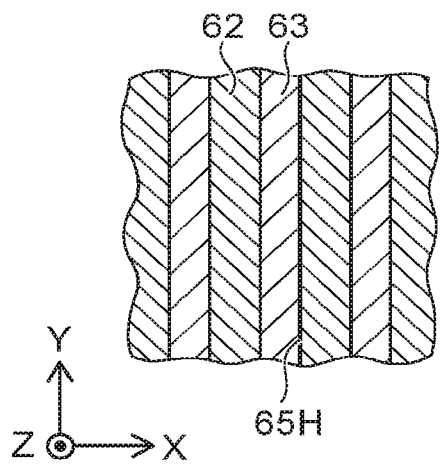
FIGS. 3A to 3F are schematic cross-sectional views illustrating substrates according to the first embodiment.
Figure 3B:
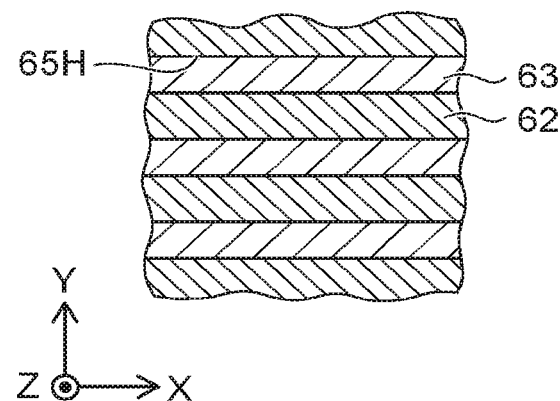

As shown in FIGS. 3A and 3B, the formation of the hole 65H (step S120) includes forming multiple holes 65H (third semiconductor members 63). The multiple holes 65H (the third semiconductor members 63) are arranged in a second direction crossing the first direction (the Z-axis direction). In the example of FIG. 3A, the second direction is the X-axis direction. In the example of FIG. 3B, the second direction is the Y-axis direction.

Figure 3C:
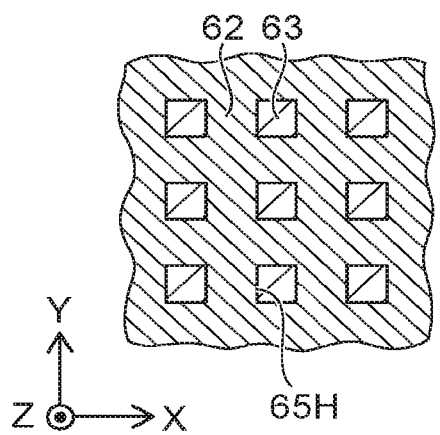
Figure 3D:
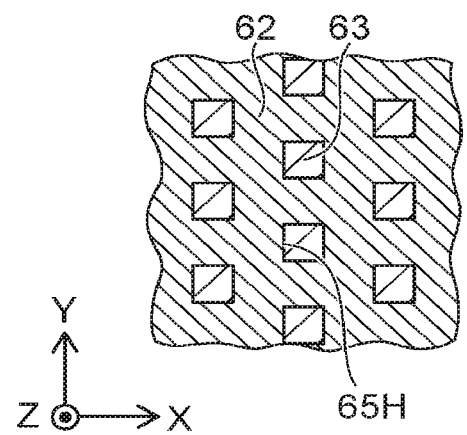

As shown in FIG. 3C, the multiple holes 65H are arranged also in a third direction (in the example, the Y-axis direction) crossing a plane including the first and second directions. As shown in FIG. 3D, the pitch of the multiple holes 65H (the third semiconductor members 63) may be different between the X-axis direction and the Y-axis direction.

Figure 3E:
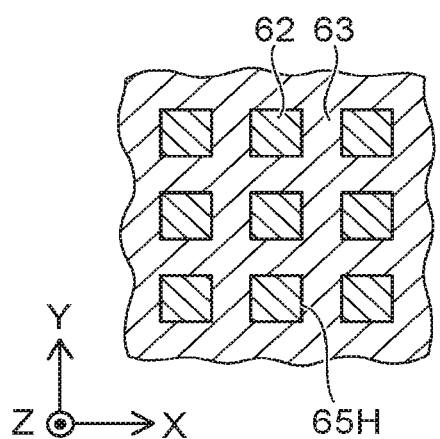
Figure 3F:
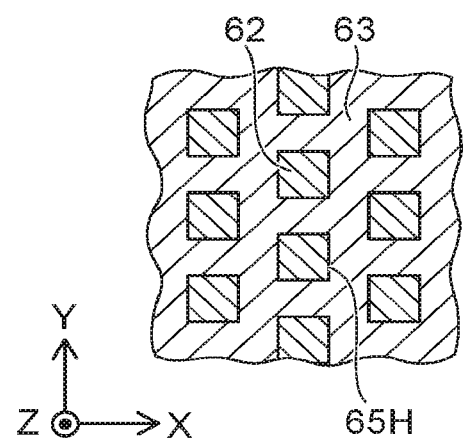

Multiple second semiconductor members 62 may be formed as shown in FIGS. 3E and 3F. In such a case, the multiple second semiconductor members 62 are separated by one hole 65H.

Second Embodiment

Figure 4:
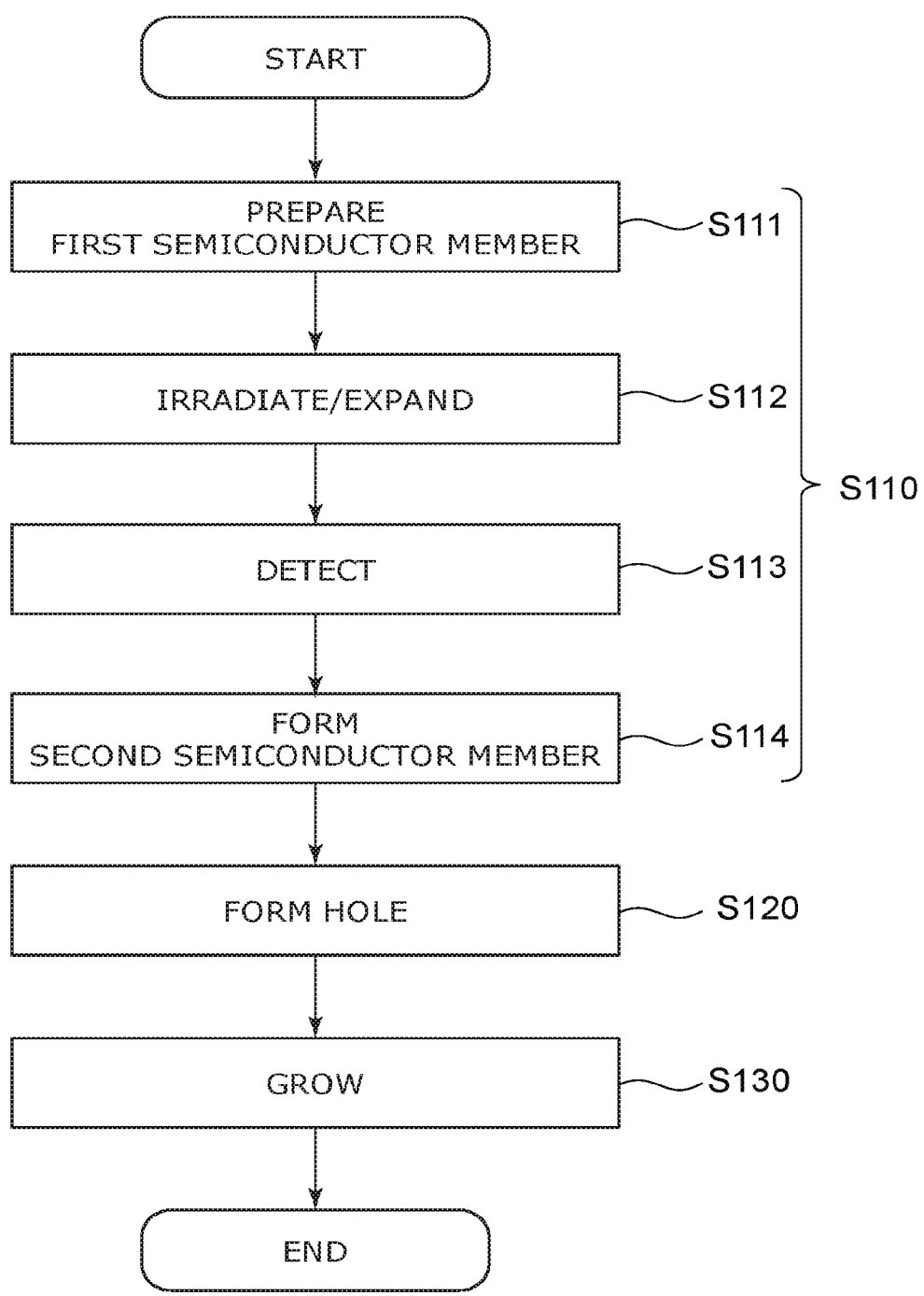
FIG. 4 is a flowchart illustrating a method for manufacturing a substrate according to a second embodiment.

FIG. 4 is a flowchart illustrating a method for manufacturing a substrate according to a second embodiment.

As shown in FIG. 4, the preparation of the structure body (step S110) includes preparing the first semiconductor member 61 (step S111). Step S110 includes causing a stacking fault to expand by irradiating ultraviolet light (step S112). Step S110 includes detecting the position of the stacking fault (step S113). Step S110 includes forming the second semiconductor member 62 (step S114).

FIGS. 5A to 5F are schematic cross-sectional views illustrating the method for manufacturing the substrate according to the second embodiment.

Figure 5A:
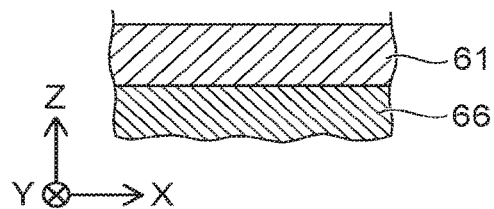
FIGS. 5A to 5F are schematic cross-sectional views illustrating the method for manufacturing the substrate according to the second embodiment.

The first semiconductor member 61 is prepared as shown in FIG. 5A (step S111).

Figure 5B:
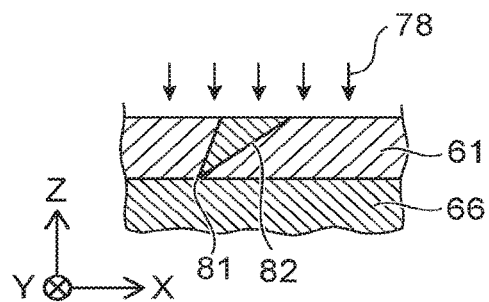

As shown in FIG. 5B, a stacking fault 82 is caused to expand in the first semiconductor member 61 from a basal plane dislocation 81 by irradiating ultraviolet light 78 on the first semiconductor member 61 (step S112). The wavelength of the ultraviolet light 78 is, for example, not less than 310 nm and not more than 370 nm. The power density of the ultraviolet light 78 is not less than 1 W/cm$^2$. The irradiation time of the ultraviolet light 78 is, for example, not less than 5 minutes and not more than 30 minutes.

Subsequently, the position of the stacking fault 82 is detected (step S113). For example, the position of the stacking fault 82 can be detected by observing photoluminescent light. For example, the position of the stacking fault 82 in the wafer (e.g., the base body 66) is stored. The stacking fault 82 that is generated by the ultraviolet light 78 disappears over time. However, the stacking fault 82 is generated when operating the semiconductor device manufactured using the substrate 68. The position of the stacking fault 82 generated when operating is the same as the position of the stacking fault 82 generated by the irradiation of the ultraviolet light 78.

Figure 5C:
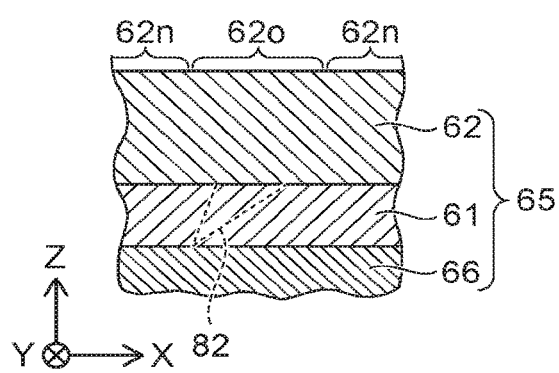

As shown in FIG. 5C, the second semiconductor member 62 is formed (step S114) after the detection of the position (step S113).

As shown in FIG. 5C, the second semiconductor member 62 includes an overlap region 62o and a non-overlap region 62n. The overlap region 62o overlaps the position of the stacking fault 82 in the first direction (the Z-axis direction). The non-overlap region 62n does not overlap the position of the stacking fault 82 in the first direction.

Subsequently, step S120 (the formation of the hole 65H) and step S130 (the growth of the third semiconductor member 63) illustrated in FIG. 4 are performed.

Figure 5D:
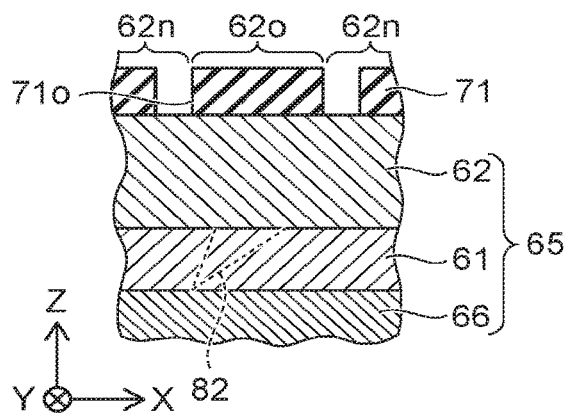

As shown in FIG. 5D, the first mask 71 that has the opening 71o is formed. The opening 71o is not formed in the overlap region 62o that overlaps the position of the stacking fault 82. The opening 71o is formed in the non-overlap region 62n that does not overlap the position of the stacking fault 82.

Figure 5E:
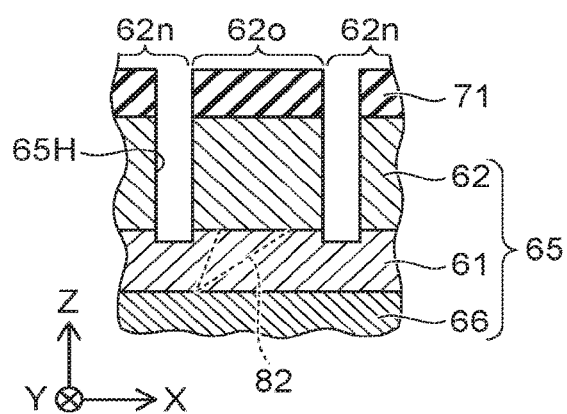

As shown in FIG. 5E, the hole 65H is formed by removing a portion of the second semiconductor member 62 by using the first mask 71 as a mask (step S120). For example, the formation of the hole 65H (step S120) includes forming the multiple holes 65H. The formation of the hole 65H includes forming at least one of the multiple holes 65H in the non-overlap region 62n based on the detection result of the position of the stacking fault 82. At least one of the multiple holes 65H is not formed in the overlap region 62o. Subsequently, the first mask 71 is removed.

Figure 5F:
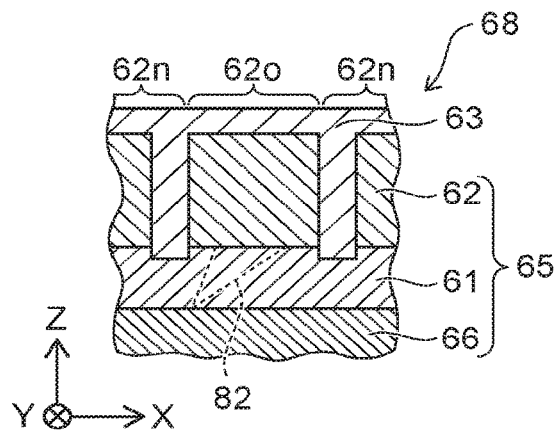

As shown in FIG. 5F, the third semiconductor member 63 is formed in the hole 65H.

In the second embodiment as shown in FIG. 5F, the second semiconductor member 62 is on the position of the stacking fault 82. The third semiconductor member 63 is selectively provided at a position at which there is no stacking fault 82. Thereby, for example, the stacking fault 82 stops at the second semiconductor member 62 even when the stacking fault 82 is generated when operating.

When the third semiconductor member 63 is provided on the position of the stacking fault 82, there are cases where the stacking fault 82 expands in the third semiconductor member 63 from the first semiconductor member 61 and reaches the upper portion of the semiconductor device. There are cases where forward degradation (Vf degradation) is caused thereby.

In the second embodiment, the second semiconductor member 62 is on the position of the stacking fault 82. Thereby, the expansion of the stacking fault 82 to the upper portion of the second semiconductor member 62 can be suppressed even when the stacking fault 82 is generated when operating.

Third Embodiment

Figure 6:
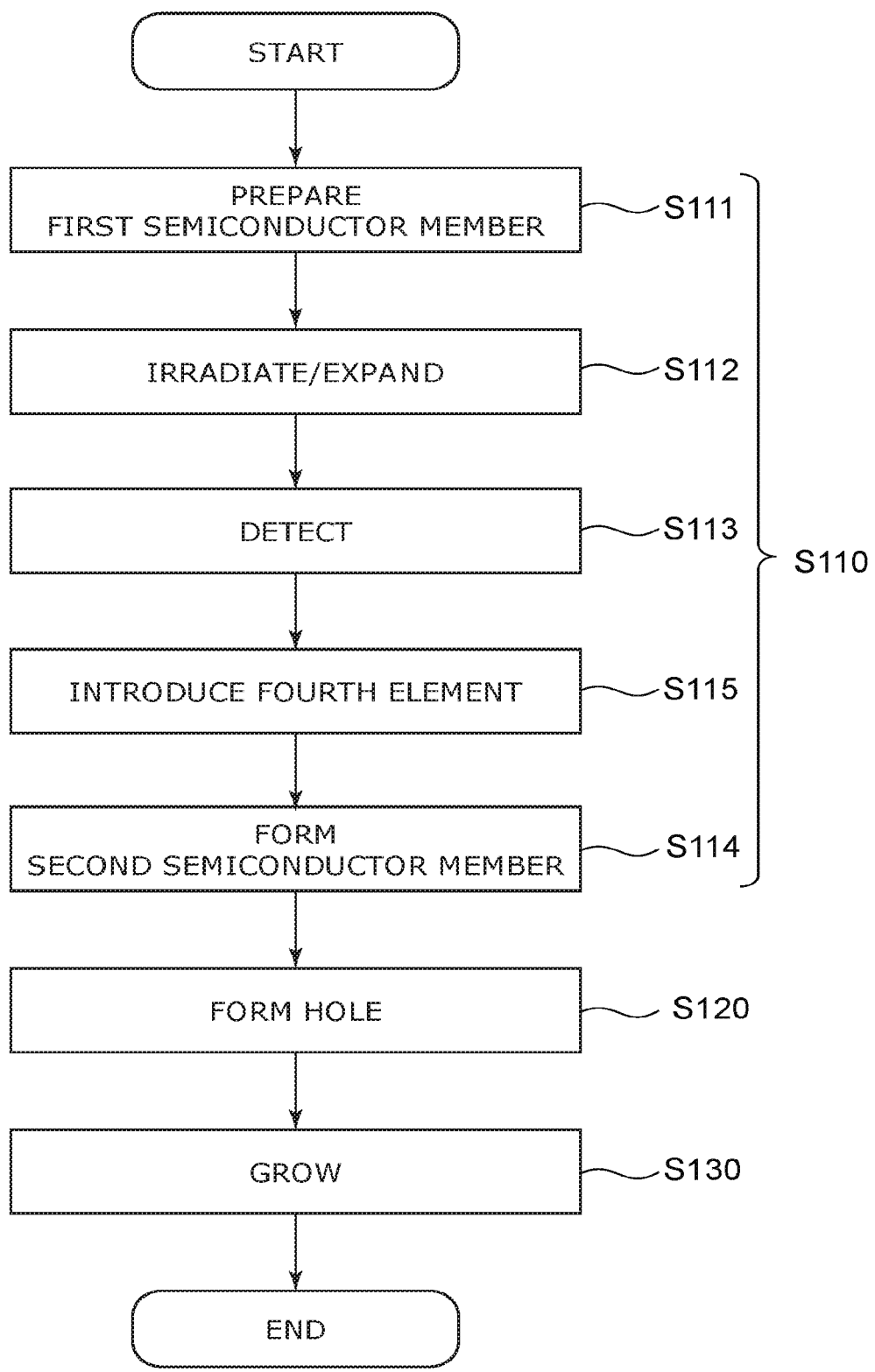
FIG. 6 is a flowchart illustrating a method for manufacturing a substrate according to a third embodiment.

FIG. 6 is a flowchart illustrating a method for manufacturing a substrate according to a third embodiment.

As shown in FIG. 6, the preparation of the structure body 65 (step S110) includes introducing a fourth element (step S115) in addition to steps S111 to S114 described with reference to FIG. 4.

FIGS. 7A to 7F, 8A, and 8B are schematic cross-sectional views illustrating the method for manufacturing the substrate according to the third embodiment.

Figure 7A:
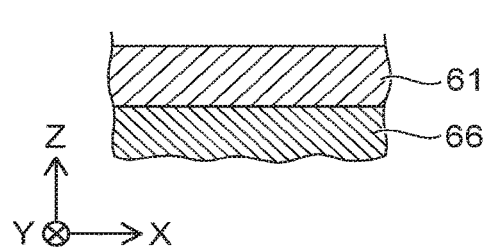
FIGS. 7A to 7F are schematic cross-sectional views illustrating the method for manufacturing the substrate according to the third embodiment.

The first semiconductor member 61 is prepared as shown in FIG. 7A (step S111).

Figure 7B:
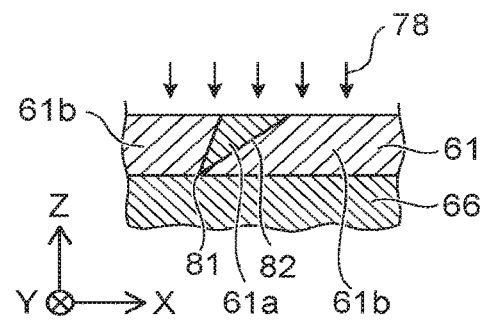

As shown in FIG. 7B, the stacking fault 82 is caused to expand in the first semiconductor member 61 from the basal plane dislocation 81 by irradiating the ultraviolet light 78 on the first semiconductor member 61 (step S112).

Subsequently, the position of the stacking fault 82 is detected. The position of the stacking fault 82 is stored. As shown in FIG. 7B, the first semiconductor member 61 includes a first region 61a that includes the position of the stacking fault 82, and a second region 61b that does not include the position of the stacking fault 82.

Figure 7C:
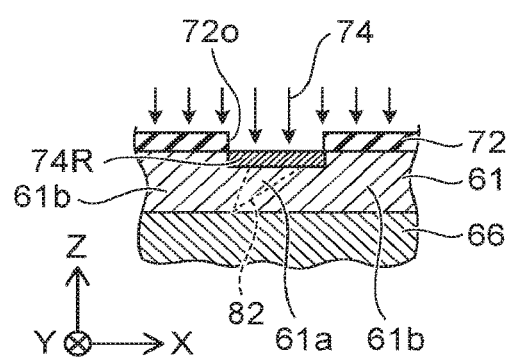

A second mask 72 is formed as shown in FIG. 7C. An opening 72o of the second mask 72 is on the first region 61a including the position of the stacking fault 82. The second mask 72 covers the second region 61b that does not include the position of the stacking fault 82. A fourth element 74 is introduced to the first semiconductor member 61 by using the second mask 72 as a mask. For example, the fourth element is ion-implanted.

The fourth element includes at least one selected from the first group described above or at least one selected from the second group described above. The fourth element is, for example, an n-type impurity or a p-type impurity. The fourth element is selectively introduced to the first region 61a that includes the position of the stacking fault 82.

Thus, based on the detection result of the position of the stacking fault 82, the fourth element is introduced to at least a portion of the first region 61a, but the fourth element is not introduced to the second region 61b. A fourth element introduction region 74R, to which the fourth element is introduced, is formed thereby (referring to FIG. 7C).

Figure 7D:
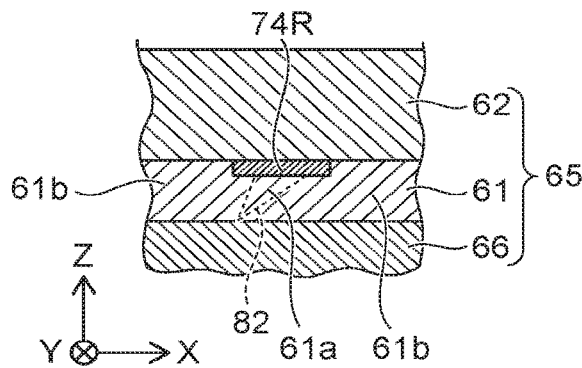

Subsequently, as shown in FIG. 7D, the second semiconductor member 62 is formed on the first region 61a and the second region 61b (step S114). The second semiconductor member 62 is on the fourth element introduction region 74R.

Figure 7E:
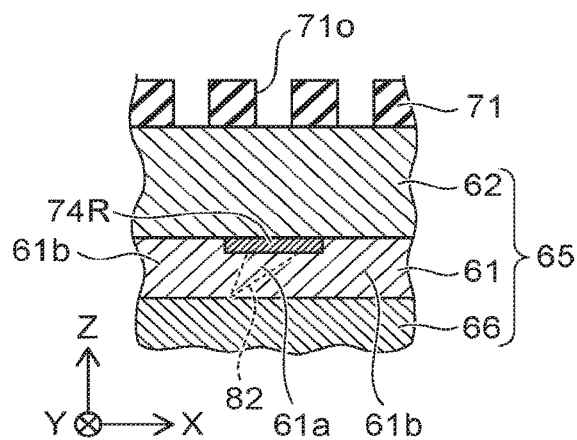
Figure 7F:
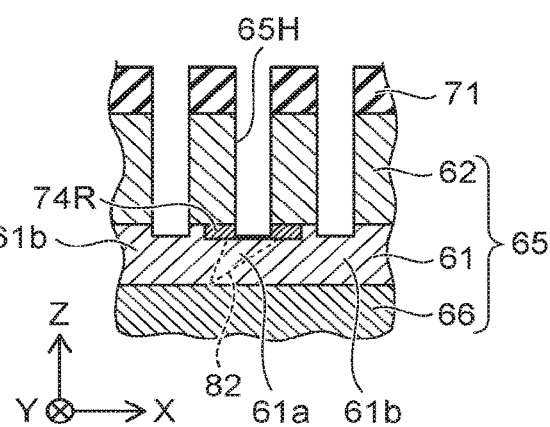

Subsequently, step S120 and step S130 described with reference to FIG. 1 are performed. The first mask 71 is formed as shown in FIG. 7E. As shown in FIG. 7F, the hole 65H is formed using the first mask 71 as a mask. The hole 65H reaches the first and second regions 61a and 61b of the first semiconductor member 61.

Figure 8A:
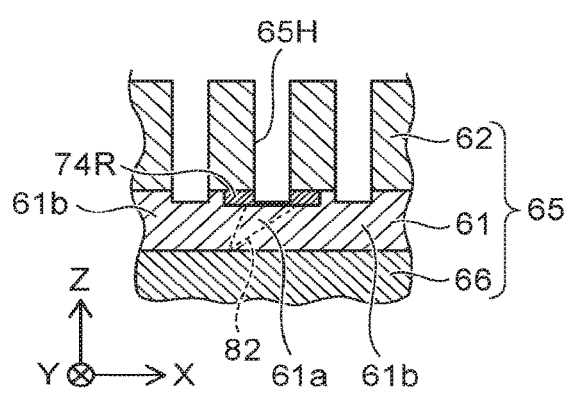
FIGS. 8A and 8B are schematic cross-sectional views illustrating the method for manufacturing the substrate according to the third embodiment.
Figure 8B:
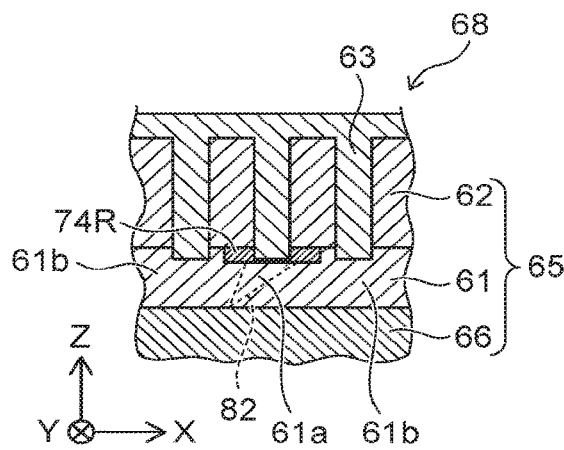

The first mask 71 is removed as shown in FIG. 8A. As shown in FIG. 8B, the third semiconductor member 63 is formed in the hole 65H.

According to such a manufacturing method, as shown in FIG. 8B, the fourth element introduction region 74R is provided at the position of the stacking fault 82. The third semiconductor member 63 contacts the fourth element introduction region 74R at the position of the stacking fault 82. In a semiconductor device manufactured using such a substrate 68, unfavorable effects caused by the stacking fault 82 can be suppressed even when the stacking fault 82 is generated when operating.

For example, when the fourth element includes at least one selected from the first group consisting of N, P, and As, the donor concentration in the fourth element introduction region 74R can be locally increased. The increase of the resistance due to the existence of the stacking fault 82 can be suppressed thereby.

For example, when the fourth element includes at least one selected from the second group consisting of B, Al, and Ga, a current path toward the position of the stacking fault 82 can be substantially blocked by the p-type fourth element introduction region 74R. The fourth element introduction region 74R acts as a lid on the position of the stacking fault 82. The stacking fault 82 can be made harmless by the fourth element introduction region 74R.

For example, when the fourth element includes at least one selected from the first group, it is favorable for the sum of the concentration of the fourth element in the region into which the fourth element is introduced (the fourth element introduction region 74R) and the concentration of the first element in the region into which the fourth element is introduced (the fourth element introduction region 74R) to be not less than the concentration of the third element in the third semiconductor member 63. It is more favorable for the sum to be greater than the concentration of the third element in the third semiconductor member 63. The increase of the resistance due to the existence of the stacking fault 82 can be more effectively suppressed thereby.

For example, when the fourth element includes at least one selected from the second group, it is favorable for the concentration of the fourth element in the region into which the fourth element is introduced (the fourth element introduction region 74R) to be greater than the concentration of the first element in the region into which the fourth element is introduced (the fourth element introduction region 74R). The fourth element introduction region 74R becomes the p-type due to such a concentration. The current path toward the position of the stacking fault 82 can be more effectively blocked.

As shown in FIG. 8A, at least a portion of the hole 65H overlaps the first region 61a in the first direction (the Z-axis direction). The fourth element introduction region 74R is easily formed to have a stable configuration.

Fourth Embodiment

Figure 9:
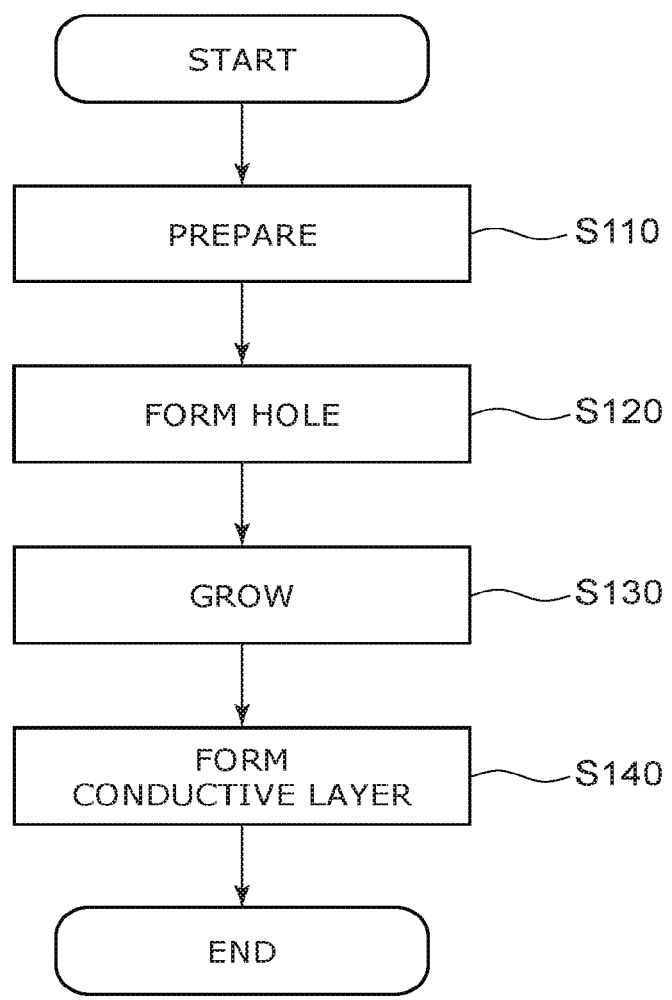
FIG. 9 is a flowchart illustrating a method for manufacturing a semiconductor device according to a fourth embodiment.

FIG. 9 is a flowchart illustrating a method for manufacturing a semiconductor device according to a fourth embodiment.

Figure 10:
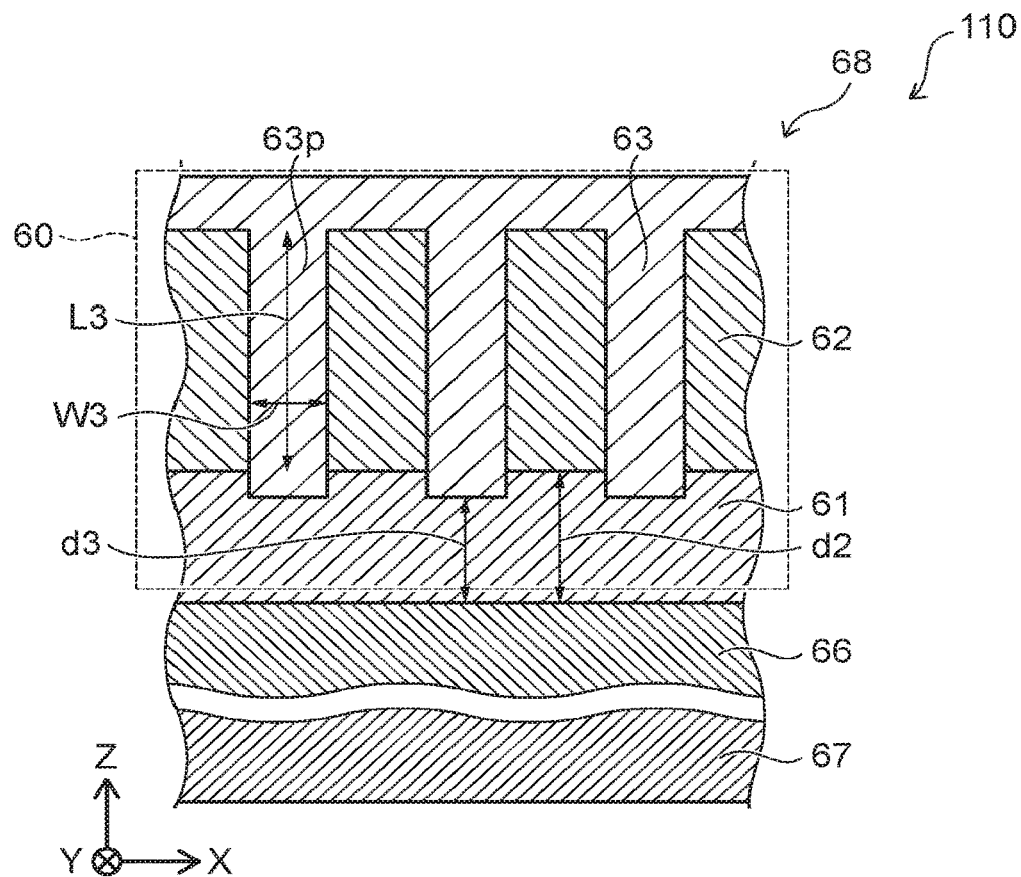
FIG. 10 is a schematic cross-sectional view illustrating the method for manufacturing the semiconductor device according to the fourth embodiment.

FIG. 10 is a schematic cross-sectional view illustrating the method for manufacturing the semiconductor device according to the fourth embodiment. As shown in FIG. 9, the method for manufacturing the semiconductor device according to the embodiment includes preparing the structure body 65 (step S110), forming the hole 65H (step S120), forming (growing) the third semiconductor member 63 (step S130), and forming a conductive layer (step S140).

The structure body 65 includes the first semiconductor member 61, which includes silicon carbide including the first element, and the second semiconductor member 62, which includes silicon carbide including the second element (referring to FIG. 2B). The first element includes at least one selected from the first group consisting of N, P, and As. The second element includes at least one selected from the second group consisting of B, Al, and Ga. The direction from the first semiconductor member 61 toward the second semiconductor member 62 is along the first direction (e.g., the Z-axis direction).

The hole 65H extends through the second semiconductor member 62 along the first direction and reaches the first semiconductor member 61 (referring to FIG. 2D). The third semiconductor member 63 includes silicon carbide including the third element, which includes at least one selected from the first group. The third semiconductor member 63 is formed in the hole 65H (referring to FIG. 2F).

As shown in FIG. 10, a semiconductor layer 60 includes the first semiconductor member 61, the second semiconductor member 62, and the third semiconductor member 63. A conductive layer 67 is electrically connected to the semiconductor layer 60. In the example, the conductive layer 67 is electrically connected to the first semiconductor member 61. The semiconductor device 110 is obtained thereby.

In the semiconductor device 110, for example, the impurity concentration is uniform and stable in the third semiconductor member 63. For example, the impurity concentration included in the second semiconductor member 62 and the impurity concentration included in the third semiconductor member 63 are easily neutralized. Stable characteristics of the SJ structure including the second semiconductor member 62 and the third semiconductor member 63 are obtained. A method for manufacturing a semiconductor device can be provided in which stable characteristics are obtained.

Fifth Embodiment

A fifth embodiment relates to the substrate 68. An example of the substrate 68 according to the embodiment is shown in FIG. 10.

As shown in FIG. 10, the substrate 68 includes the semiconductor layer 60 and the base body 66, which includes silicon carbide. The semiconductor layer 60 includes the first semiconductor member 61 that includes silicon carbide including the first element, the second semiconductor member 62 that includes silicon carbide including the second element, and the third semiconductor member 63 that includes the third element including at least one selected from the first group. The first element includes at least one selected from the first group consisting of N, P, and As. The second element includes at least one selected from the second group consisting of B, Al, and Ga. The first semiconductor member 61 is between the base body 66 and the second semiconductor member 62 in the first direction (e.g., the Z-axis direction). At least a portion of the third semiconductor member 63 extends along the first direction in the second semiconductor member 62. At least a portion of the third semiconductor member 63 contacts the first semiconductor member 61.

As shown in FIG. 10, the distance along the first direction (the Z-axis direction) between the base body 66 and the at least a portion of the third semiconductor member 63 described above is taken as the distance d3. The distance along the first direction between the base body 66 and the second semiconductor member 62 is taken as the distance d2. The distance d3 is less than the distance d2. A more reliable electrical connection between the third semiconductor member 63 and the first semiconductor member 61 is easily obtained. A uniform and stable impurity concentration in the third semiconductor member 63 is obtained. For example, the carrier concentration in the third semiconductor member 63 is greater than the carrier concentration in the first semiconductor member 61.

Sixth Embodiment

A sixth embodiment relates to a semiconductor device (e.g., the semiconductor device 110). An example of the semiconductor device according to the embodiment is shown in FIG. 10.

The semiconductor device 110 includes the base body 66 that includes silicon carbide, the semiconductor layer 60, and the conductive layer 67 that is electrically connected to the semiconductor layer 60. The semiconductor layer 60 includes the first semiconductor member 61, the second semiconductor member 62, and the third semiconductor member 63 described above. In the semiconductor device 110, the distance d3 is less than the distance d2. A more reliable electrical connection between the third semiconductor member 63 and the first semiconductor member 61 is obtained. A uniform and stable impurity concentration in the third semiconductor member 63 is obtained. For example, the carrier concentration in the third semiconductor member 63 is greater than the carrier concentration in the first semiconductor member 61.

In the substrate 68 and the semiconductor device 110 as shown in FIG. 10, the third semiconductor member 63 includes a portion 63p that faces the second semiconductor member 62 in the second direction crossing the first direction. The second direction is, for example, the X-axis direction. The second direction may be the Y-axis direction. A length L3 along the first direction (the Z-axis direction) of the facing portion 63p is greater than a length W3 along the second direction (e.g., the X-axis direction) of the facing portion 63p. A uniform impurity concentration (carrier concentration) is obtained in the third semiconductor member 63 having such a slender configuration.

Figure 11:
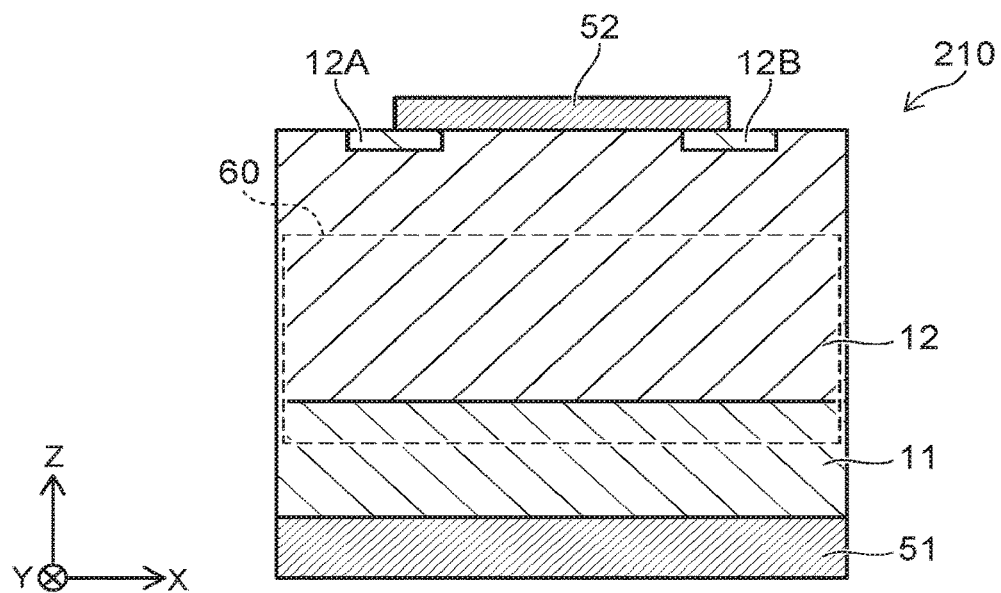
FIG. 11 is a schematic cross-sectional view illustrating a semiconductor device according to a sixth embodiment.

FIG. 11 is a schematic cross-sectional view illustrating a semiconductor device according to the sixth embodiment.

As shown in FIG. 11, the semiconductor device 210 according to the embodiment includes a first semiconductor region 11, a second semiconductor region 12, a first electrode 51, and a second electrode 52. At least one of the first semiconductor region 11 or the second semiconductor region 12 corresponds to the semiconductor layer 60. At least one of the first electrode 51 or the second electrode 52 corresponds to the conductive layer 67.

The first semiconductor region 11 is between the first electrode 51 and the second electrode 52. The second semiconductor region 12 is between the first semiconductor region 11 and the second electrode 52. For example, the first semiconductor region 11 is of a first conductivity type (e.g., the n-type), and the second semiconductor region 12 is of the first conductivity type. For example, the impurity concentration of the first conductivity type in the first semiconductor region 11 is greater than the impurity concentration of the first conductivity type in the second semiconductor region 12. For example, the second electrode 52 has a Schottky junction with the second semiconductor region 12.

In the example, a junction terminal region 12A is provided between the second semiconductor region 12 and one end portion of the second electrode 52. A junction terminal region 12B is provided between the second semiconductor region 12 and another end portion of the second electrode 52.

The first electrode 51 is, for example, a cathode electrode. The second electrode 52 is, for example, an anode electrode. For example, the first semiconductor region 11 corresponds to an $n^+$-region. For example, the second semiconductor region 12 corresponds to an $n^-$-region. For example, the second semiconductor region 12 corresponds to a drift layer.

Figure 12:
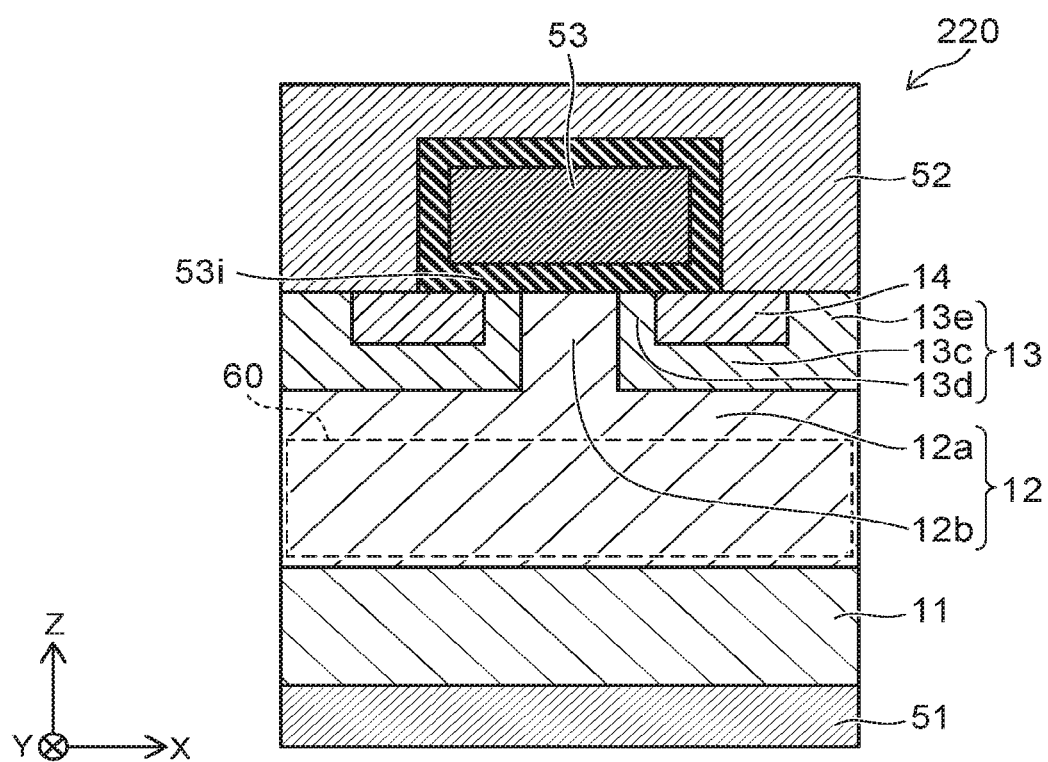
FIG. 12 is a schematic cross-sectional view illustrating a semiconductor device according to the sixth embodiment.

FIG. 12 is a schematic cross-sectional view illustrating a semiconductor device according to the sixth embodiment.

As shown in FIG. 12, the semiconductor device 220 according to the embodiment includes the first semiconductor region 11, the second semiconductor region 12, a third semiconductor region 13, a fourth semiconductor region 14, first to third electrodes 51 to 53, and an insulating part 53i. For example, the first semiconductor region 11 corresponds to the base body 66. For example, at least a portion of the second semiconductor region 12 corresponds to the semiconductor layer 60. The first electrode 51 corresponds to the conductive layer 67.

The second semiconductor region 12 is of the first conductivity type. The third semiconductor region 13 is of a second conductivity type. The fourth semiconductor region 14 is of the first conductivity type. For example, the first conductivity type is the n-type, and the second conductivity type is the p-type.

The first semiconductor region 11 is between the first electrode 51 and at least a portion of the second electrode 52 and between the first electrode 51 and the third electrode 53 in the first direction (the Z-axis direction). The direction from the third electrode 53 toward the at least a portion of the second electrode 52 described above is along the second direction (e.g., the X-axis direction).

The second semiconductor region 12 includes a first portion 12a and a second portion 12b. The first portion 12a is between the first semiconductor region 11 and the at least a portion of the second electrode 52 described above in the first direction (the Z-axis direction). The second portion 12b is between the first semiconductor region 11 and the third electrode 53 in the first direction (the Z-axis direction).

The third semiconductor region 13 includes a third portion 13c and a fourth portion 13d. The third portion 13c is between the first portion 12a and the at least a portion of the second electrode 52 described above in the first direction (the Z-axis direction). In the example, the third semiconductor region 13 further includes a fifth portion 13e.

The fourth semiconductor region 14 is between the third portion 13c and the at least a portion of the second electrode 52 described above in the first direction (the Z-axis direction). The fourth semiconductor region 14 is electrically connected to the second electrode 52.

The fourth portion 13d of the third semiconductor region 13 is between the fourth semiconductor region 14 and at least a portion of the second portion 12b of the second semiconductor region 12 in the second direction (e.g., the X-axis direction).

In the example, the fourth semiconductor region 14 is between the third portion 13c and the fifth portion 13e in the X-axis direction. The fifth portion 13e is electrically connected to the second electrode 52.

The insulating part 53*i* is between the second portion 12*b* and the third electrode 53 in the first direction (the Z-axis direction). In the example, a portion of the insulating part 53*i* is provided also between the third electrode 53 and the fourth portion 13*d* and between the third electrode 53 and a portion of the fourth semiconductor region 14 in the Z-axis direction.

For example, the first electrode 51 corresponds to a drain electrode. For example, the second electrode 52 corresponds to a source electrode. For example, the third electrode 53 corresponds to a gate electrode. The first semiconductor region 11 is, for example, a SiC substrate. The first semiconductor region 11 is, for example, an n$^+$-region. For example, the second semiconductor region 12 corresponds to a drift layer. The second semiconductor region 12 is, for example, an n$^-$-region. For example, the third semiconductor region 13 corresponds to a p-well. For example, the fourth semiconductor region 14 corresponds to an n$^+$-source. The semiconductor device 220 is, for example, a MOSFET. The semiconductor device 220 is, for example, a vertical power MOSFET. The first semiconductor region 11 may be, for example, a p$^-$-region. In such a case, the semiconductor device 220 is, for example, an IGBT (Insulated Gate Bipolar Transistor).

Figure 13:
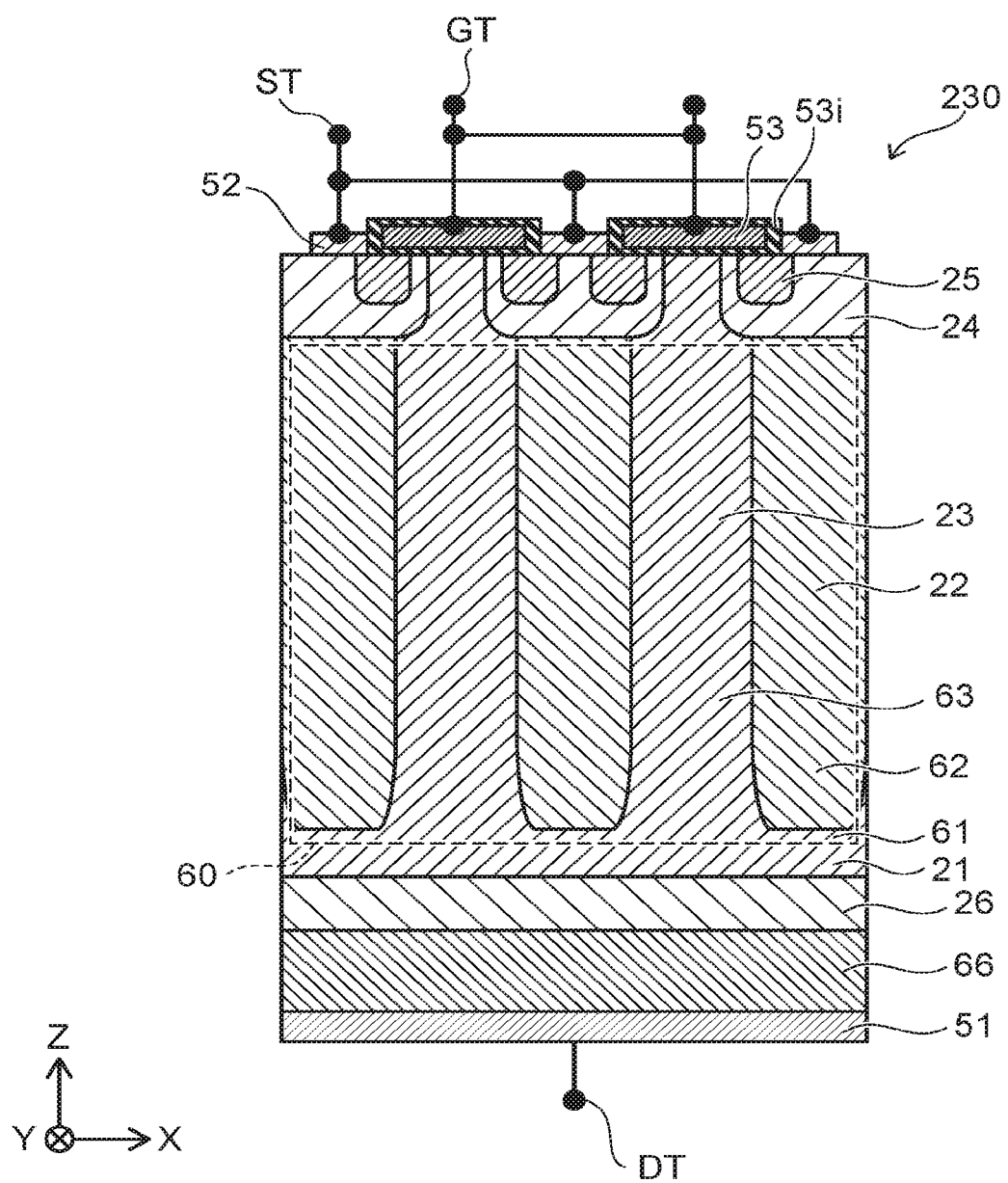
FIG. 13 is a schematic cross-sectional view illustrating a semiconductor device according to the sixth embodiment.

FIG. 13 is a schematic cross-sectional view illustrating a semiconductor device according to the sixth embodiment.

In the semiconductor device 230 according to the embodiment as shown in FIG. 13, the base body 66 is on the first electrode 51. An n$^+$-layer 26 is on the base body 66. An n-layer 21 is on the n$^+$-layer 26. The direction from the base body 66 toward the n$^+$-layer 26 is along the Z-axis direction. Multiple n-layers 23 and multiple p-layers 22 are provided on the n-layer 21. For example, the n-layers 23 and the p-layers 22 are alternately arranged along the X-axis direction. A p$^+$-layer 24 is provided on the p-layer 22. Multiple n$^+$-layers 25 are provided on a portion of the p$^+$-layer 24. A portion of the p$^+$-layer 24 is between one of the multiple n$^+$-layers 25 and another one of the multiple n$^+$-layers 25.

The insulating part 53*i* is provided on one of the multiple n$^+$-layers 25. One third electrode 53 is provided on the insulating part 53*i*. Another insulating part 53*i* is provided on another one of the multiple n$^+$-layers 25. Another one third electrode 53 is provided on the other insulating part 53*i*.

The second electrode 52 is provided on the portion of the p$^+$-layer 24 provided between the one of the multiple n$^+$-layers 25 and the other one of the multiple n$^+$-layers 25. The second electrode 52 is electrically connected to the p$^+$-layer 24.

A drain terminal DT is electrically connected to the first electrode 51. A source terminal ST is electrically connected to the second electrode 52. A gate terminal GT is electrically connected to the third electrode 53.

The semiconductor device 230 has a SJ structure that includes the multiple n-layers 23 and the multiple p-layers 22. The n-layer 21, the multiple n-layers 23, and the multiple p-layers 22 correspond to the semiconductor layer 60. The first electrode 51 corresponds to the conductive layer 67. For example, in the structure illustrated in FIG. 2F, the second semiconductor member 62 (the multiple p-layers 22) are exposed by surface polishing, etc. The p$^+$-layer 24 and the multiple n$^+$-layers 25 are formed on the multiple n-layers 23. The semiconductor device 230 is obtained thereby. In the semiconductor device 230, for example, uniform and stable impurity concentrations are obtained in the SJ structure including the multiple n-layers 23 and the multiple p-layers 22.

According to the embodiments, a method for manufacturing a substrate, a method for manufacturing a semiconductor device, a substrate, and a semiconductor device can be provided in which stable characteristics are obtained.

In the embodiments, information that relates to the impurity concentration is obtained by, for example, SIMS (Secondary Ion Mass Spectrometry), etc. In the description recited above, the impurity concentration may be, for example, the carrier concentration. For example, the carrier concentration can be measured by a C-V (capacitance-voltage) characteristic device, etc.

In the specification, "a state of being electrically connected" includes a state in which multiple conductors physically contact each other and a current flows between the multiple conductors. "A state of being electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, electrodes, insulating parts, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a substrate, the method comprising:
   preparing a structure body including a first semiconductor member and a second semiconductor member, the first semiconductor member including silicon carbide including a first element, the second semiconductor member including silicon carbide including a second element, the first element including at least one selected from a first group consisting of N, P, and As, the second element including at least one selected from a second group consisting of B, Al, and Ga, a direction from the first semiconductor member toward the second semiconductor member being along a first direction;

forming a hole that extends through the second semiconductor member along the first direction and reaches the first semiconductor member; and forming a third semiconductor member in the hole, the third semiconductor member including silicon carbide including a third element, the third element including at least one selected from the first group, wherein the preparing of the structure body includes:
  preparing the first semiconductor member;
  causing a stacking fault to expand in the first semiconductor member from a basal plane dislocation by irradiating ultraviolet light on the first semiconductor member;
  detecting a position of the stacking fault and forming the second semiconductor member after the detecting of the position, the second semiconductor member includes:
    an overlap region overlapping the position of the stacking fault in the first direction; and
    a non-overlap region not overlapping the position of the stacking fault in the first direction, the forming of the hole includes forming a plurality of holes, the forming of the hole is based on a detection result of the position of the stacking fault, at least one of the plurality of holes is formed in the non-overlap region, and at least one of the plurality of holes is not formed in the overlap region.

2. The method according to claim 1, wherein
the forming of the third semiconductor member includes growing the third semiconductor member by using a gas including a compound including the third element and carbon.

3. The method according to claim 2, wherein
the forming of the third semiconductor member includes epitaxially growing the third semiconductor member.

4. The method according to claim 2, wherein
the preparing of the structure body includes epitaxially growing the second semiconductor member on the first semiconductor member by using a gas including the second element.

5. The method according to claim 1, wherein
a concentration of the third element in the third semiconductor member is greater than a concentration of the first element in the first semiconductor member.

6. The method according to claim 1, wherein
the forming of the hole includes removing a portion of the first semiconductor member.

7. The method according to claim 1, wherein
the structure body further includes a base body including silicon carbide,
the first semiconductor member is provided on the base body, and
a distance along the first direction between the base body and the third semiconductor member is less than a distance along the first direction between the base body and the second semiconductor member.

8. The method according to claim 1, wherein
the forming of the hole includes forming a plurality of the holes, and
the plurality of holes is arranged in a second direction crossing the first direction.

9. The method according to claim 8, wherein
the plurality of holes is arranged also in a third direction crossing a plane including the first and second directions.

10. A method for manufacturing a substrate, the method comprising:
preparing a structure body including a first semiconductor member and a second semiconductor member, the first semiconductor member including silicon carbide including a first element, the second semiconductor member including silicon carbide including a second element, the first element including at least one selected from a first group consisting of N, P, and As, the second element including at least one selected from a second group consisting of B, Al, and Ga, a direction from the first semiconductor member toward the second semiconductor member being along a first direction;

forming a hole that extends through the second semiconductor member along the first direction and reaches the first semiconductor member; and forming a third semiconductor member in the hole, the third semiconductor member including silicon carbide including a third element, the third element including at least one selected from the first group, wherein the preparing of the structure body includes:
  preparing the first semiconductor member;
  causing a stacking fault to expand in the first semiconductor member from a basal plane dislocation by irradiating ultraviolet light on the first semiconductor member;
  detecting a position of the stacking fault, the first semiconductor member including a first region including the position of the stacking fault, and a second region not including the position of the stacking fault;
  based on a detection result of the position of the stacking fault, introducing a fourth element to at least a portion of the first region but not introducing the fourth element to the second region; and
  forming the second semiconductor member on the first and second regions, and the fourth element includes at least one selected from the first group or at least one selected from the second group.

11. The method according to claim 10, wherein
the fourth element includes at least one selected from the first group, and
a sum of a concentration of the fourth element in a region into which the fourth element is introduced and a concentration of the first element in the region into which the fourth element is introduced is not less than a concentration of the third element in the third semiconductor member.

12. The method according to claim 10, wherein
the fourth element includes at least one selected from the second group, and
a concentration of the fourth element in a region into which the fourth element is introduced is greater than a concentration of the first element in the region into which the fourth element is introduced.

13. The method according to claim 10, wherein
at least a portion of the hole overlaps the first region in the first direction.

* * * * *